(12) United States Patent
Sinclair et al.

(10) Patent No.: US 8,537,613 B2
(45) Date of Patent: Sep. 17, 2013

(54) MULTI-LAYER MEMORY SYSTEM

(75) Inventors: Alan Welsh Sinclair, Falkirk (GB); Nicholas James Thomas, Dundee (GB); Barry Wright, Edinburgh (GB)

(73) Assignee: SanDisk Technologies Inc., Plano, TX (US)

( * ) Notice: Subject to any disclaimer, the term of this patent is extended or adjusted under 35 U.S.C. 154(b) by 307 days.

(21) Appl. No.: 13/077,487

(22) Filed: Mar. 31, 2011

(65) Prior Publication Data

US 2012/0254574 A1    Oct. 4, 2012

(51) Int. Cl.
*G11C 11/34*    (2006.01)

(52) U.S. Cl.
USPC .............. 365/185.05; 365/185.11; 365/230.03

(58) Field of Classification Search
USPC ..................... 365/185.05, 185.11, 230.03
See application file for complete search history.

(56) References Cited

U.S. PATENT DOCUMENTS

| | | | |
|---|---|---|---|
| 5,696,917 A | 12/1997 | Mills et al. | |
| 5,869,845 A | 2/1999 | Vander Wagt et al. | |
| 5,930,167 A | 7/1999 | Lee et al. | |
| 7,336,531 B2 | 2/2008 | Roohparvar | |
| 7,903,459 B2 * | 3/2011 | Yu et al. | 365/185.03 |
| 2004/0073748 A1 | 4/2004 | Rudelic | |
| 2007/0186065 A1 | 8/2007 | Lee et al. | |
| 2008/0067573 A1 | 3/2008 | Jang et al. | |
| 2008/0084739 A1 | 4/2008 | Chae et al. | |
| 2008/0307192 A1 | 12/2008 | Sinclair et al. | |
| 2008/0316815 A1 | 12/2008 | Lin | |
| 2009/0132758 A1 | 5/2009 | Jiang et al. | |
| 2009/0248952 A1 | 10/2009 | Radke et al. | |
| 2009/0262577 A1 | 10/2009 | Tanaka | |
| 2009/0300269 A1 | 12/2009 | Radke et al. | |
| 2010/0153631 A1 | 6/2010 | Moon et al. | |

OTHER PUBLICATIONS

Hong et al., NAND Flash-based Disck Cache Using SLC/MLC Combined Flash Memory, 2010 International Workshop on Storage Network Architecture and Parallel I/Os, dated May 3, 2010 (10 pages).
International Search Report and Written Opinion issued in international application No. PCT/US2012/029661, mailed on Oct. 29, 2012 (28 pages).

\* cited by examiner

*Primary Examiner* — Son Dinh
*Assistant Examiner* — Nam Nguyen
(74) *Attorney, Agent, or Firm* — Brinks Hofer Gilson & Lione (57) ABSTRACT

A multi-later memory and method for operation is disclosed. The memory includes three or more layers, where each layer is made up of flash memory cells having a greater bit per cell storage capacity than then prior layer. The method may include the steps of directing host data directly into a first or second layer of the multi-layer memory upon receipt depending on a condition of the data. The method may also include copying data within a respective layer in a data relocation operation to generate more free blocks of memory so that data preferably stays within each layer, as well as transferring data from one layer to the next higher bit per cell layer when layer transfer criteria are met.

24 Claims, 10 Drawing Sheets

MULTI-LAYER MEMORY SYSTEM

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Two general memory cell architectures found in flash memory include NOR and NAND. In a typical NOR architecture, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells.

A typical NAND architecture utilizes strings of more than two series-connected memory cells, such as 16 or 32, connected along with one or more select transistors between individual bit lines and a reference potential to form columns of cells. Word lines extend across cells within many of these columns. An individual cell within a column is read and verified during programming by causing the remaining cells in the string to be turned on so that the current flowing through a string is dependent upon the level of charge stored in the addressed cell.

Flash memory generally provides highest performance when the number of data bits per cell is lowest, such as binary flash, also known as single level cell (SLC) flash, that stores 1 bit per cell. Flash memory that is configured to store more than one bit per cell, known as multi-level cell (MLC) flash, can store 2 or more bits of information per cell. While SLC flash memory is generally known for having better read and write performance (e.g., speed and endurance) than MLC flash, MLC flash provides more storage capacity and is generally less expensive to produce. The endurance and performance of MLC flash tends to decrease as the number of bits per cell of a given MLC configuration increases. There are continuing challenges in obtaining a desired balance of performance, capacity and cost in the design of flash memory devices using these types of flash memory cells.

SUMMARY

In order to address the challenges of using flash memory cells of different capacities to achieve desired performance, capacity and endurance for a given application, a system and method for implementing a multi-layer memory system is disclosed.

According to one aspect, a mass storage memory system is disclosed. The mass storage memory system includes an interface adapted to receive data from a host system and a plurality of memory layers. The plurality of memory layers include a first memory layer having non-volatile memory cells comprising a first bit per cell storage capacity, a second memory layer having non-volatile memory cells comprising a second bit per cell storage capacity, the second bit per cell storage capacity being greater than the first bit per cell storage capacity, and a third memory layer having non-volatile memory cells comprising a third bit per cell storage capacity, the third bit per cell storage capacity being greater than the second bit per cell storage capacity. The mass storage memory system further includes a controller in communication with the interface and the plurality of memory layers, and is configured to direct data received from the host to one or more of the plurality of layers, and to transfer data between the plurality of memory layers.

According to another aspect, a mass storage memory system has an interface adapted to receive data from a host system and a plurality of memory layers. The memory layers include a first memory layer having non-volatile memory cells of a first bit per cell storage capacity, a second memory layer having non-volatile memory cells of a second bit per cell storage capacity that is greater than the first bit per cell storage capacity, and a third memory layer having non-volatile memory cells of a third bit per cell storage capacity that is greater than the second bit per cell storage capacity. The mass storage memory also includes a controller in communication with the interface and the plurality of memory layers where the controller is configured to direct data received at the interface from the host to the first memory layer, to move data from the first memory layer to the second memory layer when a number of free blocks in the first memory layer is below a first minimum threshold and upon detection of an amount of valid data in the first memory layer exceeding a first valid data threshold, and to move data from the second memory layer to the third memory layer when a number of free blocks in the second memory layer is below a second minimum threshold and upon detection of an amount of valid data in the second memory layer exceeding a second valid data threshold.

In yet another aspect, a method is disclosed for managing data in a multi-layer memory having an interface, a plurality of memory layers, and a controller in communication with the interface and the plurality of memory layers. The controller directs data received at the interface to a first memory layer of the plurality of layers, the first memory layer having non-volatile memory cells comprising a first bit per cell storage capacity and moves data from the first memory layer to a second memory layer when a first criteria is met, where the second memory layer has non-volatile memory cells with a second bit per cell storage capacity greater than the first bit per cell storage capacity. The controller moves data from the second memory layer to a third memory layer when a second criteria is met, where the third memory layer has non-volatile memory cells with a third bit per cell storage capacity that is greater than the second bit per cell storage capacity.

DETAILED DESCRIPTION

Figure 1:
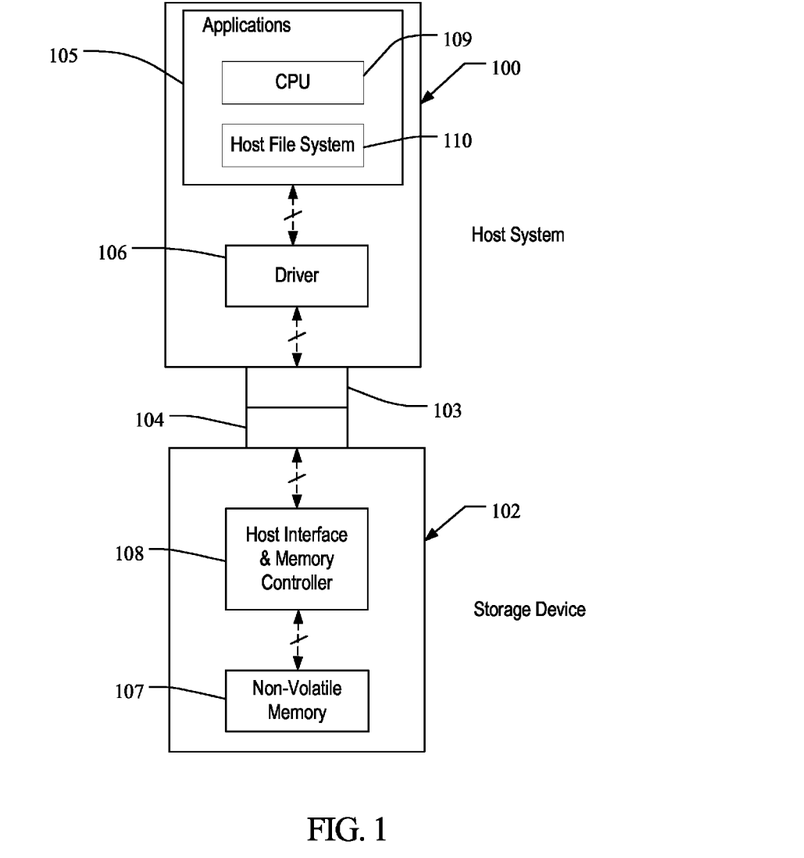
FIG. 1 is a block diagram of a system that may implement aspects of the invention.

A system suitable for use in implementing aspects of the invention is shown in FIG. 1. A host system 100 controls data stored into and retrieved from a physical storage device 102. The storage device 102 may be a flash device that is embedded in the host, such as a solid state disk (SSD) drive, an external storage device separate from the host, or a memory card or other removable flash drive that is removably connected to the host 100, and may communicate through a mechanical and electrical connector such as connectors 103, 104, or wirelessly, using any of a number of available wired or wireless interfaces. The host 100 may a data handling device, such as a tablet computer, mobile phone, personal digital assistant, home network router, a personal computer (PC) or any other type of data handling device.

The host system 100 may be viewed as having two major parts, insofar as the storage device 102 is concerned, made up of a combination of circuitry and software. They are an applications portion 105 and a driver portion 106 that interfaces with the storage device 102. In a PC, for example, the applications portion 105 can include a processor 109 running word processing, graphics, control or other popular application software, as well as the file system 110 for managing data on the host 100. In a camera, cellular telephone or other host system that is primarily dedicated to performing a single set of functions, the applications portion 105 includes the software that operates the camera to take and store pictures, the cellular telephone to make and receive calls, and the like.

The storage device 102 contains non-volatile memory 107. The non-volatile memory 107 may be configured in a combination of single level cell (SLC) type of flash memory and/or a multi-level cell (MLC) type flash memory. The storage device 102 also includes a host interface and controller 108 that may include a processor, instructions for operating the processor and a logical block to physical block translation tables.

Figure 2:
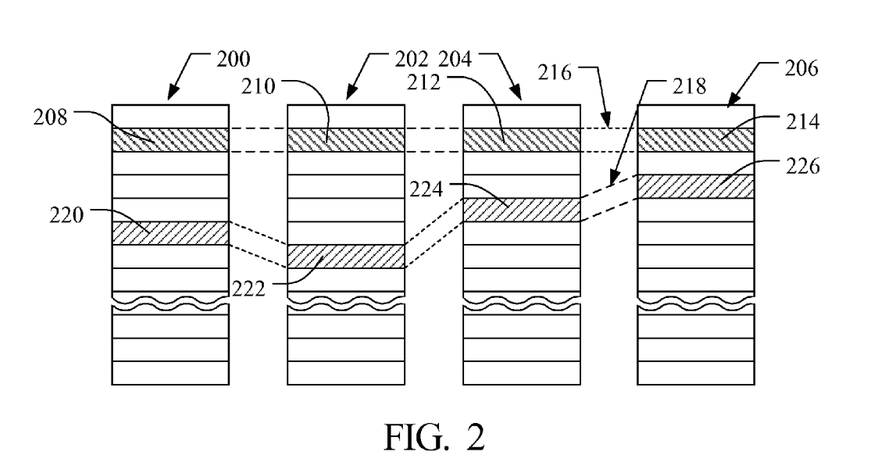
FIG. 2 illustrates an example physical memory organization of the storage device of FIG. 1.

The non-volatile flash memory may be arranged in blocks of memory cells. A block of memory cells is the unit of erase, i.e., the smallest number of memory cells that are physically erasable together. For increased parallelism, however, the blocks may be operated in larger metablock units. One block from each of at least two planes of memory cells may be logically linked together to form a metablock. Referring to FIG. 2, a conceptual illustration of a representative flash memory cell array is shown. Four planes or sub-arrays 200, 202, 204 and 206 memory cells may be on a single integrated memory cell chip, on two chips (two of the planes on each chip) or on four separate chips. The specific arrangement is not important to the discussion below and other numbers of planes may exist in a system. The planes are individually divided into blocks of memory cells shown in FIG. 2 by rectangles, such as blocks 208, 210, 212 and 214, located in respective planes 200, 202, 204 and 206. There may be dozens or hundreds of blocks in each plane. Blocks may be logically linked together to form a metablock that may be erased as a single unit. For example, blocks 208, 210, 212 and 214 may form a first metablock 216. The blocks used to form a metablock need not be restricted to the same relative locations within their respective planes, as is shown in the second metablock 218 made up of blocks 220, 222, 224 and 226.

Figure 3:
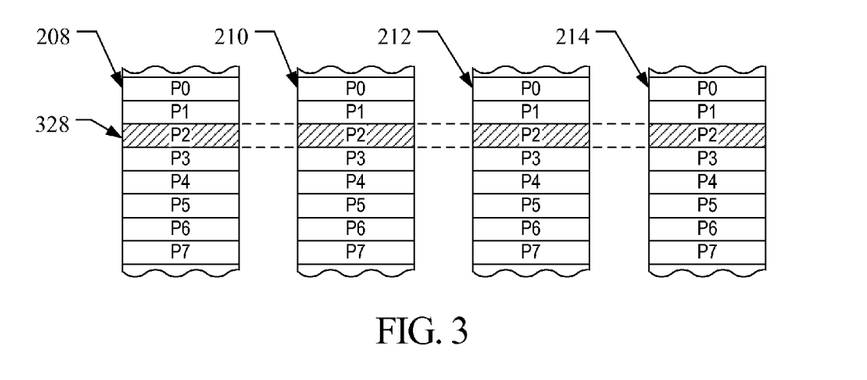
FIG. 3 shows an expanded view of a portion of the physical memory of FIG. 2.

The individual blocks are in turn divided for operational purposes into pages of memory cells, as illustrated in FIG. 3. The memory cells of each of blocks 208, 210, 212, and 214, for example, are each divided into eight pages P0-P7. Alternately, there may be 16, 32 or more pages of memory cells within each block. A page is the unit of data programming within a block, containing the minimum amount of data that are programmed at one time. The minimum unit of data that can be read at one time may be less than a page. A metapage 328 is illustrated in FIG. 3 as formed of one physical page for each of the four blocks 208, 210, 212 and 214. The metapage 328 includes the page P2 in each of the four blocks but the pages of a metapage need not necessarily have the same relative position within each of the blocks. A metapage is the maximum unit of programming. The blocks disclosed in FIGS. 2-3 are referred to herein as physical blocks because they relate to groups of physical memory cells as discussed above. As used herein, a logical block is a virtual unit of address space defined to have the same size as a physical block. Each logical block includes a range of logical block addresses (LBAs) that are associated with data received from a host 100. The LBAs are then mapped to one or more physical blocks in the storage device 102 where the data is physically stored.

Figure 4A:
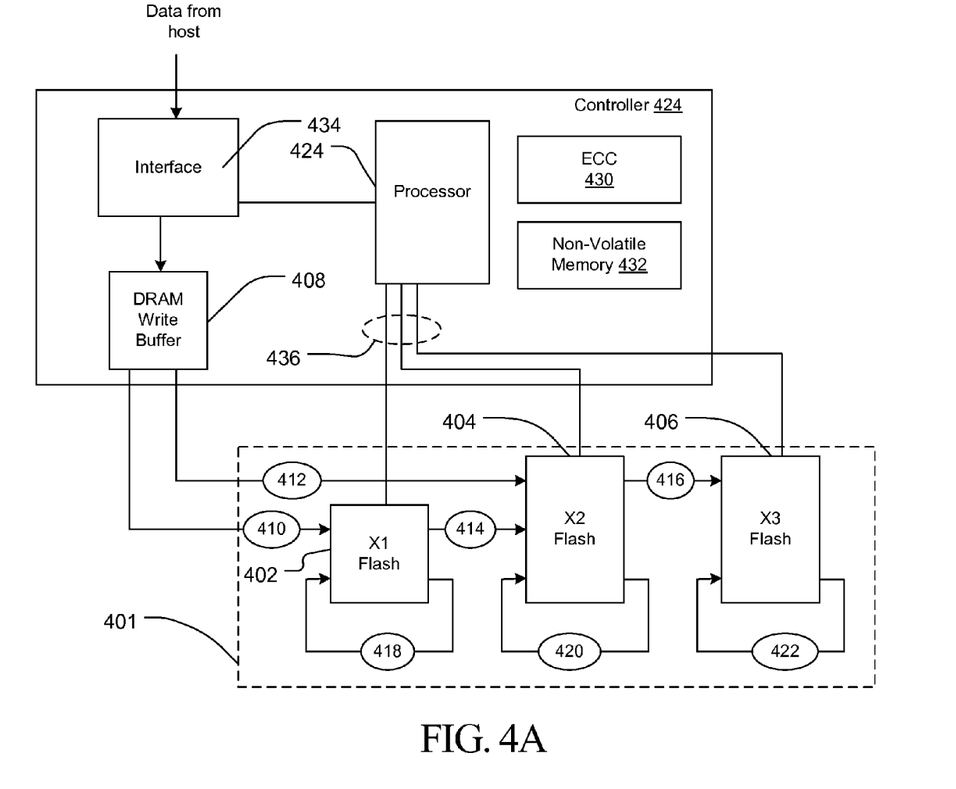
FIG. 4A illustrates a multi-layer memory organization of the storage device of FIG. 1 according to one embodiment.
Figure 4B:
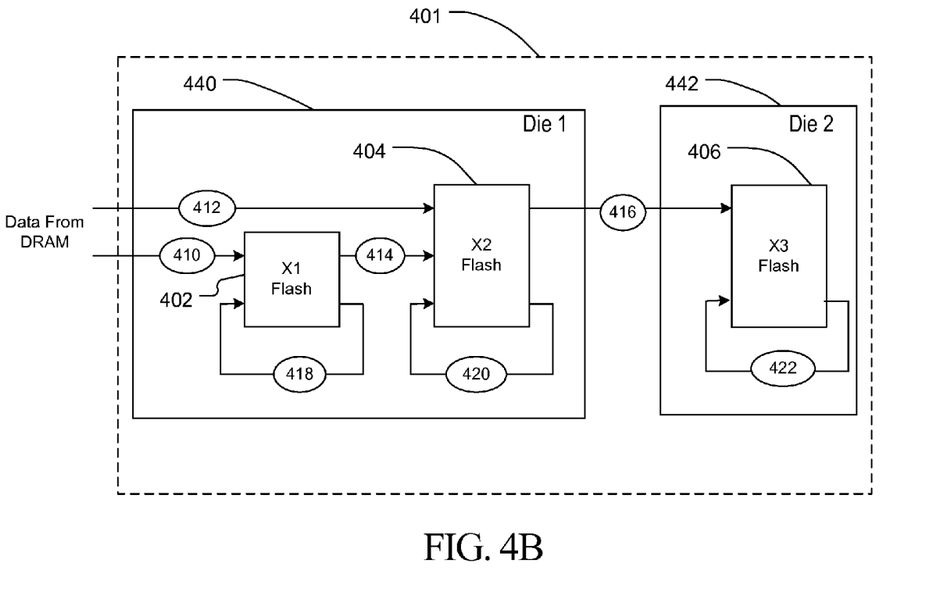
FIG. 4B illustrates an alternative physical arrangement of the multi-layer memory of FIG. 4A.

Referring now to FIG. 4A, one embodiment of the storage device 102 of FIG. 1 is shown having a non-volatile memory 401 that may include three layers of flash memory cells 402, 404, 406, each layer having a different bit per cell capacity. As shown, a first flash memory layer 402 may be configured as binary flash having a single bit per cell capacity. The first flash memory layer is also referred to herein as X1 flash. A second flash memory layer 404 may be configured as MLC flash, for example with a two bit per cell capacity, also referred to herein as X2 flash. A third flash memory layer 406 may also be configured as MLC flash, but having a greater bit per cell capacity than the second flash memory layer 404. In this example the third flash memory layer is illustrated as three bit per cell MLC flash, also referred to herein as X3 flash. The different flash layers 402, 404, 406 may all be disposed on the same physical die, each layer may be fabricated on respective separate die, or the layers may be fabricated on a combination of single flash layer die and combined flash layer die. Although specific bit per cell configurations of one, two and three bits are illustrated, other combinations are contemplated where the first flash memory layer has a lower bit per cell configuration than the second flash memory layer and the second flash memory layer, in turn, has a lower bit per cell configuration than the third flash memory layer. FIG. 4B illustrates the non-volatile memory 401 of FIG. 4A where the first and second flash memory layers 402, 404 are located on one die 440 and the third flash memory layer 406 is located on a separate die 442.

A dynamic random access memory (DRAM) buffer 408 of the controller 424 receives data from the host 100 over an interface 434, such as a Serial Advanced Technology Attachment (also known as a Serial ATA or SATA) interface. The DRAM buffer 408, under direction from the processor 424 of the controller, directs data received from the host at the interface 434 to the multi-layer non-volatile memory 401 in the storage device. The DRAM write buffer 408 in the storage device is in communication with the first and second flash memory layers 402, 404. Also, the first flash memory layer 402 is in communication with the second flash memory layer 404 and the second flash memory layer 404 is in communication with the third flash memory layer 406.

The controller 424 may be implemented in a single integrated circuit chip and may communicate with the different layers 402, 404, 406 in the non-volatile memory 401 over one or more command channels 436. The controller may have its own internal bus that links non-volatile memory 432 in the controller 424 containing code to initialize ("boot") the system, DRAM 408, interface 434, and circuits 430 that calculate and check an error correction code (ECC) for data passing through the controller between the multi-layer flash memory 401 and the host. Controller executable code for implementing memory management instructions such as described herein may be stored in the multi-layer flash memory 401, for example in the first flash memory layer 402.

In one implementation, all received host data may be initially sent to the first flash memory layer before being moved within the first flash memory layer, or to a subsequent layer, as set forth in greater detail below. In another implementation, data received from the host is directed from the DRAM 408 to the first flash memory layer 402 when the received data is in random LBA order (at line 410), or from the DRAM 408 directly to the second flash memory layer, bypassing the first flash memory layer, when the received data is in sequential LBA order (at line 412). The controller may progressively move data from the first flash memory layer 402 to the second flash memory layer 404 (at line 414) and from the second flash memory layer to the third flash memory layer (at 416) at appropriate times. Also, garbage collection to create new free blocks within each flash memory layer is preferably performed such that data is recycled within the flash memory layer (at lines 418, 420 and 422).

Figure 5:
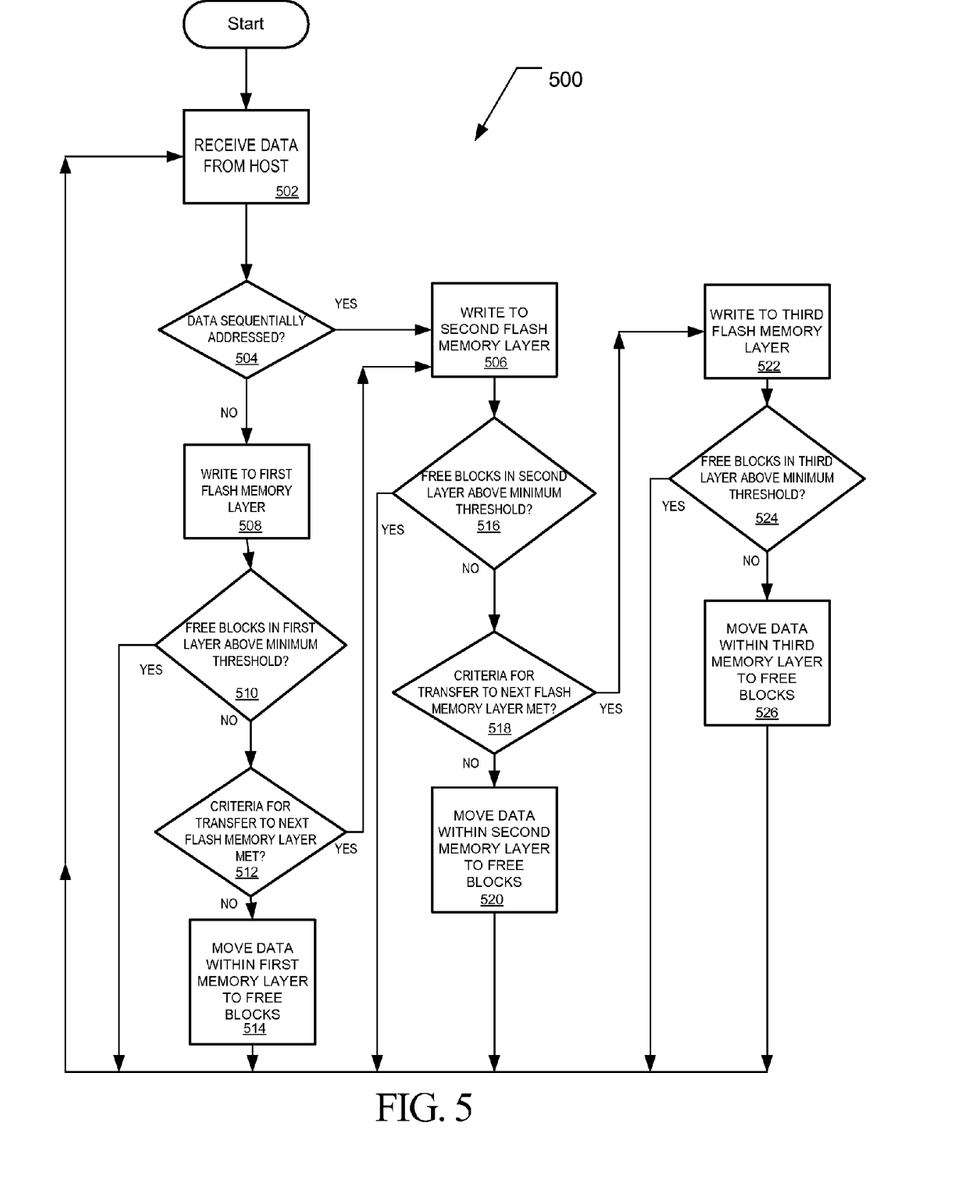
FIG. 5 is a flow diagram illustrating a method for operating a multi-layer memory.

Referring to FIG. 5, an exemplary method implemented by the controller of the storage device for moving data into and/or between the flash layers is disclosed. In one implementation, when data is received from a host write (at 502), the controller selects a memory layer to receive data from the host. The selection may be based on whether the data from the host that is received at the DRAM from the interface, such as a SATA interface, is sequential or non-sequential (at 504). For example, if the data received is sequentially addressed with host LBA addresses, the controller may direct the data from the DRAM directly to the second flash memory layer (at 506). In contrast, if the data is random or non-sequentially addressed data, that data may be directed from the DRAM straight to the first flash memory layer (at 508). In one implementation, data received at any one time from the host is considered to be sequential if the host LBA data addresses of the data received are sequential for an amount of data sufficient to fill a complete metapage of a metablock in the multi-layer memory.

In each of the flash memory layers, the controller of the storage device monitors flash memory layer transfer criteria. For example, the flash memory layer transfer criteria may be whether there are enough free blocks left in the flash memory layer and a total amount of valid data contained in the flash memory layer. Once the controller determines that the number of free blocks is less than a minimum threshold for the flash memory layer, the controller next determines whether the amount of valid data in the flash memory layer is above a transfer threshold. When the number of free blocks in a flash memory layer is below the minimum threshold, and the total amount of valid data in that flash memory layer reaches a threshold amount, the controller may cause data from that flash memory layer to be transferred to the next flash memory layer. Thus, if a criteria for transfer to a next flash memory layer is satisfied in the first flash memory layer, a block of previously programmed data is selected by the controller from which to copy data into the second flash memory layer in order to free up the space in the first flash memory layer (at 510, 512, 506). Similarly, blocks in the second flash memory layer may have data transferred into the third flash memory layer to free up blocks in the second flash memory layer upon the second flash memory layer meeting its criteria for transfer to the next flash layer (at 516, 518, 522).

The criteria for determining when to transfer data from a source memory layer to an destination layer, which may include having less than a minimum number of free blocks and a threshold amount of valid data, may be the same or different for each layer. The last layer, in this example the third flash memory layer, would not have a next higher capacity MLC layer to send data to and would therefore not have an assigned transfer criteria. In one example, the transfer criteria threshold for the first and second flash memory layers may be identifying that the layer currently contains at least a predetermined percentage of valid data, such as 90%. In another embodiment, the transfer criteria may be both that there is currently only a threshold number of free blocks in the layer and that the layer contain at least a predetermined percentage of valid data before a block in that layer may be selected for having it data transferred to the next memory layer. The threshold number of free blocks may be a minimum number such as one or more free blocks. The data selected for relocation from the source to the next flash memory layer is preferably from the block having the least recently programmed, or "coldest" host data. The controller may select this block based on order of programming information maintained for each previously programmed block in the layer in question.

Concurrently with accepting data from the host, or transferring data from a first layer to a next higher bit per cell capacity layer, the controller reclaims blocks by copying valid data from previously programmed blocks having both valid and obsolete data and then recycling the blocks from which all the valid data was copied. This block reclaiming procedure may be in the form of a standard garbage collection technique where groups of data are kept together and consolidated as new data in the same address run is received, or may be a relocation procedure, as further discussed below, where data is not consolidated into the same address groupings. The garbage collection or relocation procedure is preferably implemented by the controller independently in each of the flash memory layers. The valid data copy process, whether garbage collection or relocation, is implemented within each layer such that data moved in the process is preferably maintained in the same flash memory layer. As shown in FIG. 5, the controller checks to see if a sufficient number of free blocks exist in the first layer and, if not, performs copy operations on blocks of data within the first layer to consolidate valid data and create additional free blocks (at 510, 514). This data copy process is independently executed in the second and third layers as well (at 516, 520, 524, 526).

The above-noted method preferentially relocates data within the same flash memory layer and only moves data to a subsequent layer if the current layer is almost full of valid data. Also, by moving data between layers that comes from the least recently programmed block in a source layer, data tends to be filtered from the first flash memory layer to the third flash memory layer such that "hot" data tends to reside in the first flash memory layer, less actively updated data tends to reside in the second flash memory layer, and the "cold" data mainly resides in the third and final flash memory layer. Data is considered "hot" if it is data that has very recently been updated, as it may be more likely that that data is in active use and will be updated again in a short period of time. In one implementation, the transfer of data from the second flash memory layer to the third flash memory layer is preferably done as a background operation, when no host data write commands are pending (e.g. when the host interface is idle), so as not to reduce average write speed for the storage device. Any operation, apart from a host write operation, may be scheduled as a background operation to reduce impact on average write speed.

In order to implement the above method and structure described, the controller may maintain a linked list of data blocks within each flash memory layer to record the order in which blocks were programmed in that layer. Additionally, the controller may implement storage address re-mapping (STAR) techniques within each of the layers to further enhance the efficiency of data transfer and memory usage.

Although any of a number of known memory management techniques may be used to implement the multi-layer memory system described herein, a controller configured to utilize STAR techniques is described herein. One advantage of STAR is the ability to increase performance of memory systems in random write applications, which are characterised by the need to write short bursts of data to unrelated areas in the logical block address (LBA) address space of a device, that may be experienced in solid state disk (SSD) applications in personal computers. In one implementation of the STAR technique, host data is mapped from a first logical address assigned by the host to blocks of contiguous logical addresses in a second logical address space. As data associated with fully programmed blocks of addresses is made obsolete, a data relocation procedure is initiated where the controller selects a previously fully programmed block in a layer having the least amount of valid data, or having less than a threshold amount of valid data, and relocates the valid data in those blocks to free up those blocks for use in writing more data. The relocated data is contiguously written to a relocation block in the same memory layer in the order it occurred in the source block needing data relocation regardless of the logical address assigned by the host. In this manner, overhead may be reduced by not purposely consolidating logical address runs assigned by the host (as in typical garbage collection). A storage address table is used to track the mapping between the logical address assigned by the host and the second logical address and subsequent changes in the mapping due to subsequent relocation in the memory layer.

Figure 6:
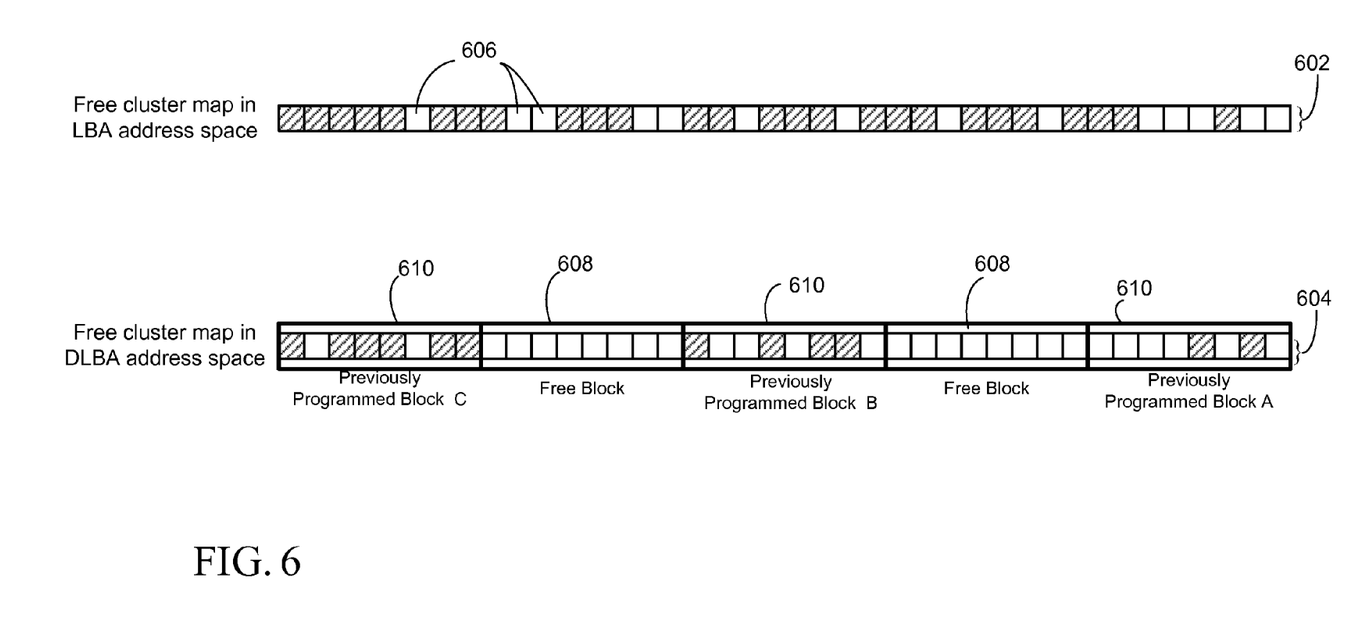
FIG. 6 is an example of LBA address space and an associated DLBA address space that may be utilized in the system of FIG. 1.

Referring to FIGS. 6-9, a hypothetical section of the host free cluster map in LBA address space 602 and the free cluster map in the second logical address space, referred to herein as device logical address space or DLBA address space 604, at a given time may be represented as shown in FIG. 6. In the LBA address space 602, free clusters 606 are dispersed at essentially random locations. In the DLBA address space 604, two free blocks 608 are available and there are three previously programmed blocks 610 having differing numbers of obsolete (free) clusters 606.

Figure 7:
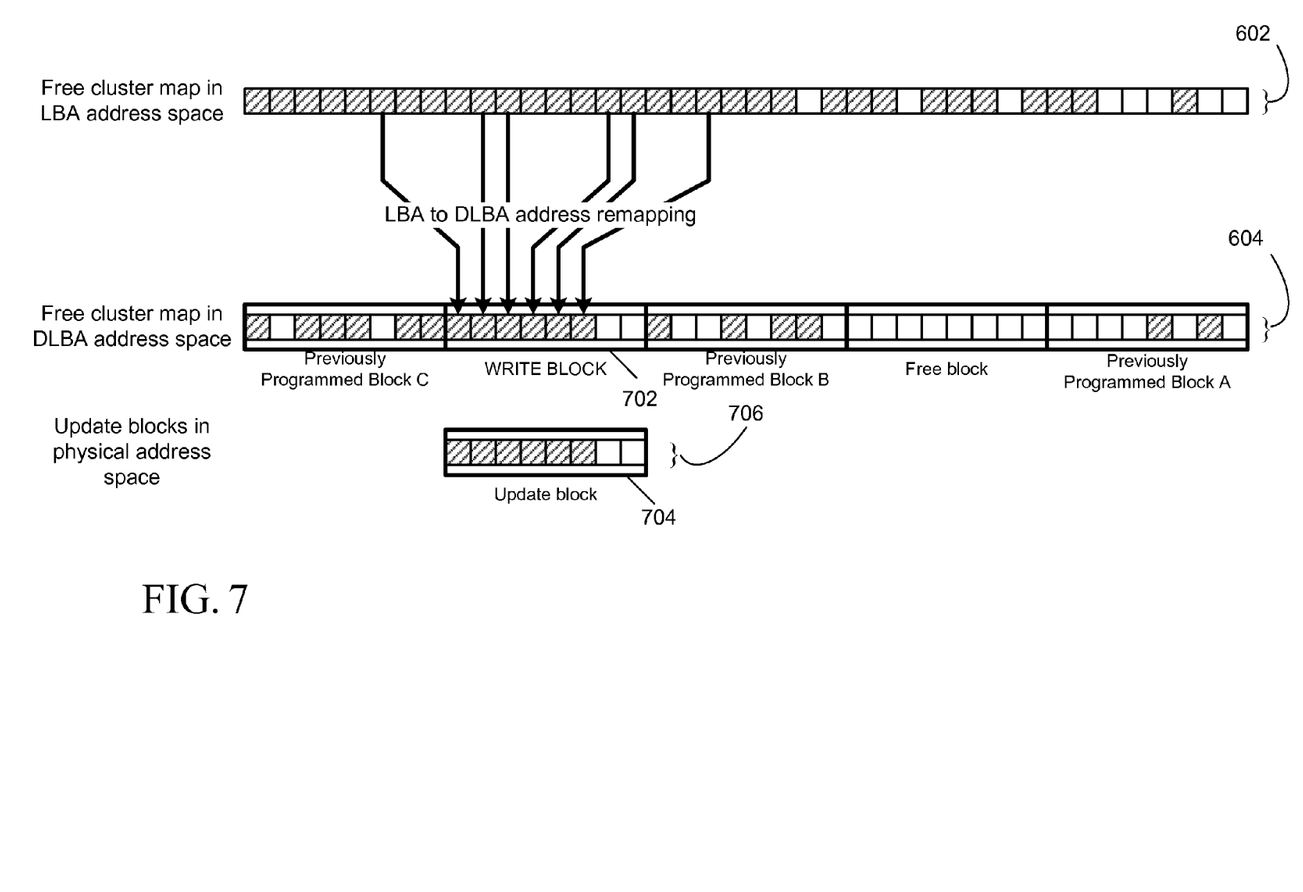
FIG. 7 illustrates an example of LBA to DLBA mapping for data received from a host.

When the host next has data to write to the storage device, it allocates LBA address space 602 wherever it is available. FIG. 7 shows how the storage address re-mapping algorithm allocates one of the available free blocks 170 to be the write block 702, and how each LBA address is mapped to a sequential cluster in the DLBA space available in the write block 702. The write block 702 in DLBA space is written to in the order the LBA addresses are written, regardless of the LBA address position. In this example it is assumed that the time order in which the host used free LBA clusters is the same as the address order for ease of illustration, however the controller implementing the storage address re-mapping algorithm would assign DLBA addresses in the write block 702 in the time order LBA addresses are used, regardless of the LBA address number order. Data is written in a write block in one or more DLBA runs. A DLBA run is a set of contiguous DLBA addresses that are mapped to contiguous LBA addresses in the same LBA run. A DLBA run must be terminated at a block boundary in DLBA address space 604. When a write block 702 becomes filled, a free block 608 is allocated as the next write block 702.

DLBA blocks are aligned with blocks 704 in physical address space 706 of the flash memory, and so the DLBA block size and physical address block size are the same. The arrangement of addresses in the DLBA write block 702 are also then the same as the arrangement of the corresponding update block in physical address space. Due to this correspondence, no separate data consolidation, commonly referred to as garbage collection, is ever needed in the physical update block. In common garbage collection operations, a block of logical addresses is generally always reassembled to maintain a specific range of LBA addresses in the logical block, which is also reflected in the physical block. More specifically, when a memory system utilizing common garbage collection operations receives an updated sector of information corresponding to a sector in particular physical block, the memory system will allocate an update block in physical memory to receive the updated sector or sectors and then consolidate all of the remaining valid data from the original physical block into the remainder of the update block. In this manner, standard garbage collection will perpetuate blocks of data for a specific LBA address range so that data corresponding to the specific address range will always be consolidated into a common physical block. The relocation operation discussed in more detail below does not require consolidation of data in the same address range. Instead, the relocation operation performs address re-mapping to create new blocks of data that may be a collection of data from various physical blocks, where a particular LBA address range of the data is not intentionally consolidated.

Figure 8:
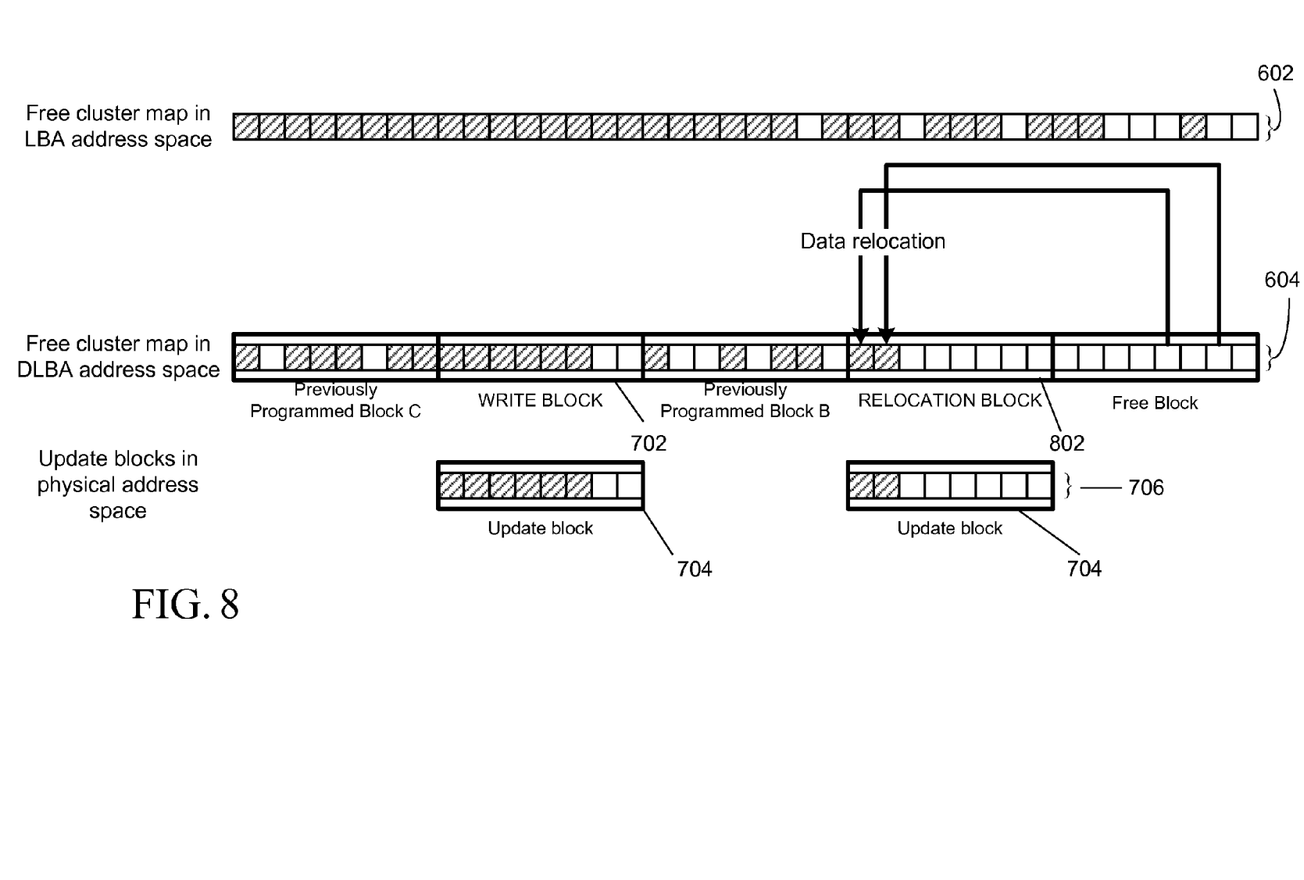
FIG. 8 illustrates a data relocation operation in DLBA address space and corresponding updates bocks in physical address space.

As mentioned previously, the STAR algorithm operates to ensure that a sufficient supply of free blocks is available for the sequential write algorithm to operate. The STAR algorithm manages the creation of free blocks by relocating valid data from previously programmed blocks having a mix of valid and obsolete data to a special write block known as the relocation block 802 (FIG. 8). The previously programmed block currently selected for relocation is referred to as the reclaim block.

Referring now to FIGS. 7-8, an illustration of a data relocation process is shown. The storage address re-mapping algorithm designates a free block as the relocation block 802, to which data is to be relocated from selected previously programmed blocks to create additional free blocks. Valid data in the reclaim block (block A of FIG. 7) is selected in the order that the valid data appears in the reclaim block and relocated to sequential and contiguous addresses in the relocation block 802, to convert the reclaim block to a free block 608. A corresponding update block 704 in the physical address space 706 is also assigned to receive the relocated data. As with the update block 704 used for new data received from the host, the update block 704 for receiving relocated data will never require a garbage collection operation to consolidate valid data because the relocation operation has already accomplished the consolidation in DLBA address space 604.

Figure 9:
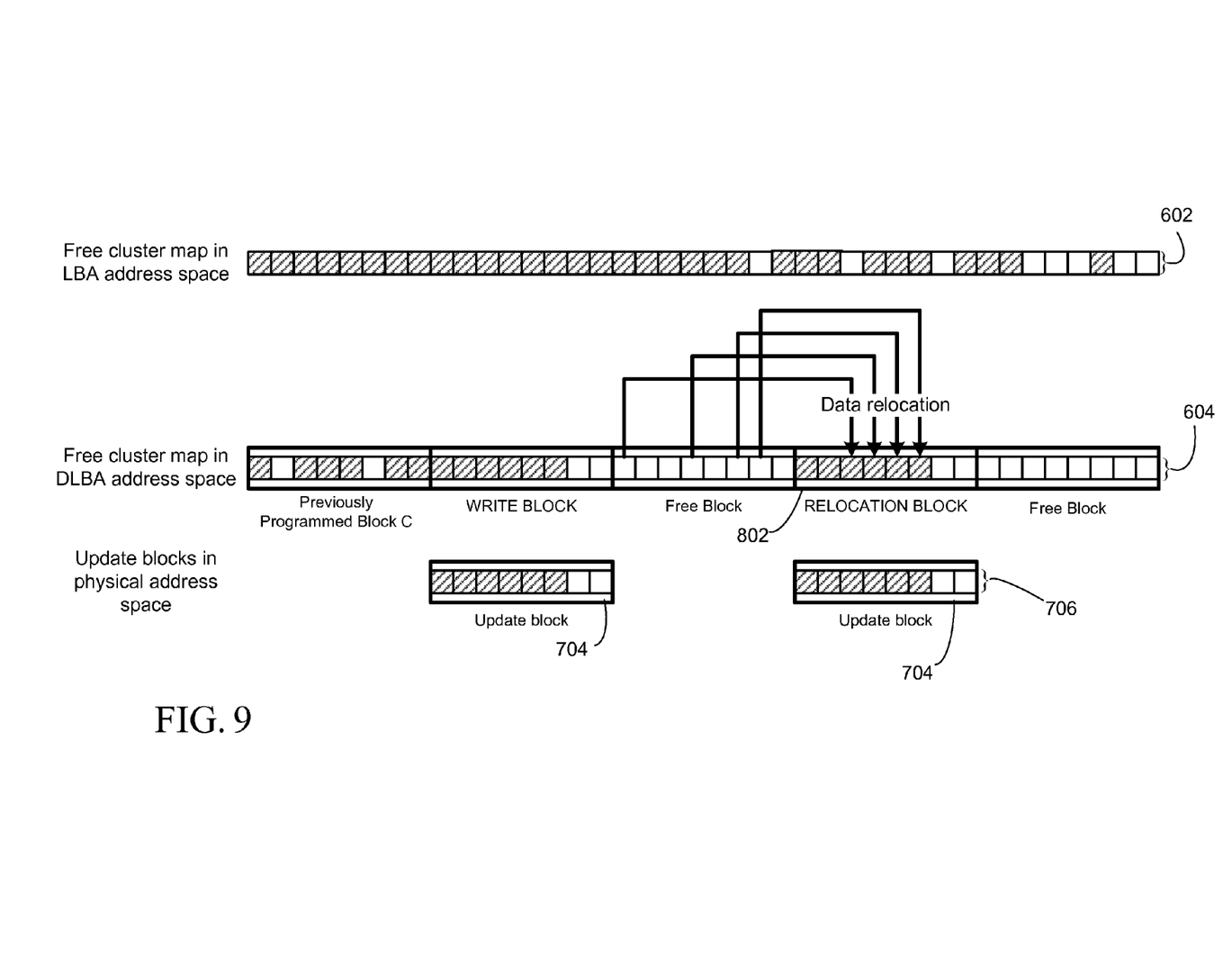
FIG. 9 illustrates a second data relocation operation following the data relocation operation of FIG. 8.

A next reclaim block (previously programmed block B of FIG. 8) is identified from the remaining previously programmed blocks as illustrated in FIG. 9. The previously programmed block with the least valid data is again designated as the reclaim block and the valid data of the reclaim block is transferred to sequential locations in the open relocation block. A parallel assignment of physical addresses in the update block 704 is also made. Again, no data consolidation is required in the physical update block 704 mapped to the relocation block 802. Relocation operations on previously programmed blocks are performed as background operations to create free blocks at a rate sufficient to compensate for the consumption of free blocks that are designated as write blocks. The example of FIGS. 6-9 illustrate how a write block and a relocation block may be separately maintained, along with respective separate update blocks in physical address space, for new data from the host and for relocated data from previously programmed blocks. Allocation of a new write block for associating new data received from a host is only performed when a current write block is fully programmed. Similarly, a new relocation block is preferably only allocated after the prior relocation block has been fully programmed. The new relocation block preferably only contains unwritten capacity, i.e. is only associated with obsolete data ready to erase, or is already erased and contains no valid data, upon allocation.

In the implementation noted above, new data from a host is associated with write blocks that will only receive other new data from the host and valid data relocated from previously programmed blocks in a relocation operation is moved into relocation blocks that will only contain valid data from one or more previously programmed blocks. In other implementations, the new data and the relocated data may be transferred to a single write block without the need for separate write and relocation blocks. The selection by the controller of a previously programmed block as a reclaim block may be accomplished by selecting any previously programmed block on a list of previously programmed blocks that is associated with an amount of valid data that is below a threshold (which may be a fixed threshold or a variable such as an average amount of valid data for the current previously programmed blocks), or may be accomplished by selecting based on a specific ranking (based on the amount of valid data associated with the previously programmed block) of the available previously programmed blocks. Additional details on versions of the STAR technique usable with the system and methods disclosed herein may be found in U.S. application Ser. No. 12/036,014, filed Feb. 22, 2008 and published as US Pub. No. 2008/0307192, wherein the entirety of the aforementioned application is incorporated herein by reference.

The relocation operation described in FIGS. 6-9 relocates relatively "cold" data from a block from which "hot" data has been made obsolete to a relocation block containing similar relatively cold data. This has the effect of creating separate populations of relatively hot and relatively cold blocks. The block to be reclaimed is always selected as a hot block containing the least amount of valid data. Creation of a hot block population reduces the memory stress factor, by reducing the amount of data that need be relocated.

Figure 10:
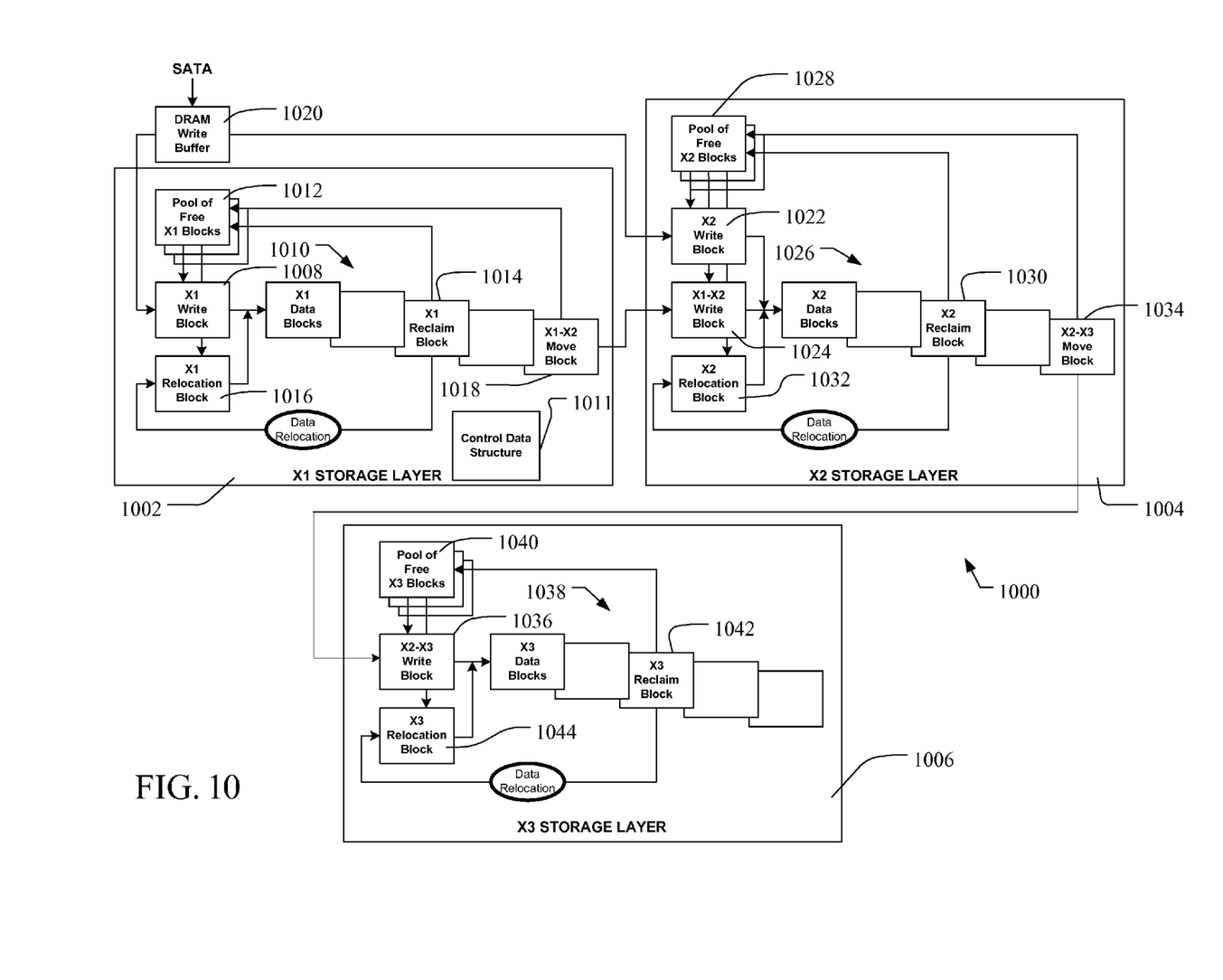
FIG. 10 is an alternative embodiment of the storage device with multi-layer memory organization of FIG. 4A utilizing a storage address re-mapping (STAR) memory management arrangement.

In an embodiment of the multi-layer memory and method, the controller 108 implements the STAR technique illustrated in FIGS. 6-9 in each of the respective flash memory layers. In an alternative embodiment of the storage device of FIG. 4A, a STAR-enabled version of the multi-layer memory system is illustrated in FIG. 10, where the first flash memory layer has a lesser bit per cell capacity than the second flash memory layer, and the second flash memory layer has a lesser bit per cell capacity than the third flash memory layer. As in the example of FIG. 4A, 1-bit, 2-bit and 3-bit per cell flash memory layers 1002, 1004, 1006 have been illustrated, although other increasing series of bit per cell memory layers may be used, and in other increase increments. A controller and associated command lines that would otherwise be included in FIG. 10 are omitted for better illustration of the flash memory layers and to simplify the figure.

The first flash memory layer 1002 receives host data with non-sequential host LBA addresses at an open write block 1008. As each write block is fully programmed, it becomes one of a group of previously programmed data blocks 1010 and the block is added to a list of previously programmed blocks maintained in the first flash memory layer 1002 that includes the order of programming of the previously programmed block within the group of previously programmed blocks 1010. When a pool of free blocks 1012 in the first flash memory layer 1002 falls below a desired threshold, the controller will select a previously programmed block (but not a currently open write block or relocation block) with a desired amount of obsolete or valid data from the list of previously programmed blocks and make that block a reclaim block 1014 on which the data relocation process described above will be applied to relocate the valid data of the reclaim block 1014 to an open relocation block 1016 in the first flash memory layer 1002 so that a reclaim process initiated in the first flash memory layer 1002 keeps the relocated data within the first flash memory layer 1002. The identified reclaim block 1014, once the reclaim process is complete, is then added to the pool of free blocks 1012 as all the valid data from the reclaim block has been relocated. When the currently open relocation block 1016 is eventually filled, it is added to the list of previously programmed blocks 1010 and the controller designates a new relocation block 1016 using one of the free blocks in the pool of free blocks 1012 within the first memory layer 1002.

As noted in the method described in FIG. 10, when one or more criteria regarding the amount of valid data in the first flash memory layer is met, data from one of the previously fully programmed blocks is moved into a block in the second flash memory layer. The block in the first flash memory layer 1002 from which data will be moved directly into the second flash memory layer 1004 is selected, where the selected block may be the block in the first layer least recently programmed with host data as determined from a list of previously programmed blocks maintained by the controller for each layer and is labeled as the X1-X2 move block 1018 in FIG. 10. Once the data in that move block 1018 is moved to a block in the second flash memory layer, the move block 1018 becomes a free block and is added to the pool of free blocks 1012 in the first flash memory layer 1002. A control data structure 1011 of the first flash memory layer 1002 may store the list for the first flash memory layer that includes the order the previously programmed block was written to in the group of previously programmed blocks 1010. The control data structure 1011 may be a portion of the first flash memory layer 1002 that includes lists and tables, such one or more storage address tables (SAT), maintained by the controller for managing each layer of the storage device.

The second flash memory layer 1004 is operated in much the same manner as the first flash memory layer 1002. One exception is that data may arrive at the second flash memory layer 1004 in two ways: from a host write containing sequentially addressed host data that is directed by the controller directly from the DRAM buffer 1020 to an open write block 1022, or as moved data received from the first flash memory layer 1002 and stored in a separate write block, designated as an X1-X2 write block 1024 in FIG. 10. As each write block 1022 or X1-X2 write block 1024 is fully programmed, it becomes one of the chain of previously programmed data blocks 1026 and the block 1022, 1024 is added to a list of previously programmed blocks maintained in the flash memory layer that includes an order the previously programmed block was written to in the group of previously programmed blocks 1026. This list may be maintained by the controller in the control data structure 1011 of the first flash memory layer. When the number of free blocks in the pool of free blocks 1028 in the second flash memory layer 1004 falls below a desired threshold, the controller will select a previously programmed block with a desired amount of obsolete or valid data from the chain of previously programmed blocks 1026 and make that block a reclaim block 1030 to which the data relocation process described above will be applied to relocate the valid data of the reclaim block 1030 to an open relocation block 1032 in the second flash memory layer 1004 so that a reclaim process initiated in the second flash memory layer 1004 keeps the relocated data within the second flash memory layer 1004. The identified reclaim block 1030, once the reclaim process is complete, is then added to the pool of free blocks 1028 as all the valid data from the reclaim block 1030 has been relocated. When the currently open relocation block 1030 is eventually filled, it is added to the list of previously programmed blocks and the controller designates a new relocation block using one of the free blocks in the pool of free blocks 1028 within the second memory layer 1004.

Similar to the first flash memory layer, and noted in the method described in FIG. 5, when one or more criteria regarding the fullness of the second flash memory layer 1004 is met, data from one of the previously programmed blocks is moved into a block in the third flash memory layer 1006. The block in the second memory layer from which data will be moved directly into the third flash memory layer 1006 is selected, where the selected block may be the least recently programmed block in the second layer as determined from a list of previously programmed blocks maintained by the controller for each layer in the control data structure 1011, and is labeled as the X2-X3 move block 1034 in FIG. 10. Once the data in that move block 1034 is moved to a block in the third flash memory layer, the move block 1034 becomes a free block and is added to the pool of free blocks 1028 in the second flash memory layer 1004. The criteria for selecting when to move data from the second flash memory layer 1004, and for selecting which previously programmed block or blocks from which to move data, may be the same or different than the criteria applied by the controller to the first flash memory layer.

The third flash memory layer 1006 receives data transferred from the move block 1034 of the second flash memory layer 1004 at a write block 1036. The third flash memory layer 1006 differs from the preceding layers in that it only receives data from the second flash memory layer and does not receive data from the DRAM buffer 1020. In an alternative embodiment, host data may be received at the third flash memory layer 1006 directly from the DRAM buffer 1021 The third flash memory layer 1006 also differs from the prior layers in that it is the last layer in the multi-layer memory and thus will not have a move block designated by the controller for transferring data to another flash memory layer. In other embodiments it is contemplated that more than three layers of different, progressively higher bit per cell capacity may be utilized where each layer but the final layer will include a block designated as the move block. The write block 1036, when fully programmed, becomes one of the chain of previously programmed data blocks 1038 and is added to a list of previously programmed blocks maintained in the data control structure 1011 of the first flash memory layer 1002 that includes the order the previously programmed block was written to in the group of previously programmed blocks 1038. This list may be maintained by the controller in the control data structure 1011 of the first flash memory layer. When a pool of free blocks 1040 in the third flash memory layer 1006 falls below a desired threshold, the controller will select a previously programmed block with a desired amount of obsolete or valid data from the chain of previously programmed blocks 1038 and make that block a reclaim block 1042 to which the data relocation process described above will be applied to relocate the valid data of the reclaim block 1042 to an open relocation block 1044 in the third flash memory layer 1006 so that relocated data remains within the third flash memory layer 1006. The reclaim block 1042 is added to the pool of free blocks 1040 after all the valid data has been relocated and the relocation block 1044 is added to list of previously programmed blocks, and replaced with a new relocation block from one of the free blocks within the third memory layer 1006.

Alternative embodiments for selecting the move block 1018, 1034 in the first and second layers are contemplated. Instead of selecting the least recently programmed block based on the order in which the block was programmed, in another embodiment the move block may be selected based the age of the data in the previously programmed block. In other words, selecting the previously programmed block having the oldest average data based on age data for each data element (sector, cluster or other sub-block data granularity that is being tracked) in each previously programmed block. The age of data in the previously programmed blocks may be maintained by the controller in the control data structure 1011 as part of the SAT tables or other lists that map logical and/or physical addresses. In one implementation, the age information for the data may be a relative age, where the age for a particular piece of data in a block is recorded as a number representing the order it was first written into the storage device from the host. The controller would, assuming that transfer criteria such as those discussed previously had been met, then select the block having the oldest average age of data. An advantage of this alternative technique for selecting the move block is that it may do a more thorough job of segregating "cold" and "hot" data between the flash memory layers. Using the least recently programmed block as the sole criteria might miss older data that has been relocated within the flash memory layer and thus is now part of a more recent previously programmed block In another alternative embodiment, the separate reclaim blocks 1014, 1030 and move blocks 1018, 1034 in the first and second flash memory layers of FIG. 10 may be replaced with only a move block in each layer, where a portion of the data in the move block for the layer is dedicated for transfer to the next higher capacity layer and a remaining portion of data is relocated to the respective relocation block 1016, 1032 for the layer. In this alternative embodiment, selection of the combination move/reclaim block in each of the first and second layers may be accomplished either by selecting the least recently programmed block, or by selecting the block with the oldest average data. The amount of data to transfer from the selected combination move/reclaim block may be a fixed amount or a percentage, for example fifty percent of the valid data in the block may be designated for transfer to the next layer and the remaining fifty percent may be relocated within the layer. The selection of which fifty percent to transfer from the identified move/reclaim block may be made based on the age of the data as tracked by the controller in the control data structure 1011.

In other alternative embodiments, additional considerations regarding whether or not to transfer data to a next layer may be overlayed with the programming order or data age considerations noted above. For example, in one embodiment it may also be beneficial to increase performance by maintaining older (i.e. "colder") data in a lower bit per cell capacity flash memory layer if that data is frequently read. Read counts for data or blocks of data may also be maintained in the multi-layer memory, such as in the control data structure 1011 in the first flash memory layer 1002 of FIG. 10. The read count information may be used to supplement the data transfer criteria such that data from the least frequently programmed block, or the block with the oldest average age of data, will not be selected for transfer to a next higher bit per cell layer if the number of read operations on that data is above a predetermined threshold.

A system and method for implementing a multi-layer memory has been disclosed. The multi-layer memory includes an interface for receiving host data, at least three layers of progressively higher bit per cell capacity flash memory and a controller or control circuitry that is configured to manage progressive transfer of data between flash memory layers when certain criteria are met and copying (garbage collection/relocation of data) within each flash memory layer based on criteria for maintaining a desired number of free blocks in each layer. Advantages of the disclosed system and method include the ability to take advantage of increased burst write speed for data from an interface such as SATA by directing data initially to lower bit per cell flash memory layers, such as SLC or two bit per cell MLC, that are typically higher performance types of flash. Also, the use of the highest bit per cell flash layer, three bits per cell in the non-limiting example discussed above, to receive "cold" data may help to reduce write amplification and thus improve the endurance of that layer of flash, while taking advantage of the lower expense of the higher bit per cell layer.

We claim:

1. A mass storage memory system, comprising:
an interface adapted to receive data from a host system;
a plurality of memory layers, the plurality of memory layers comprising:
    a first memory layer having non-volatile memory cells comprising a first bit per cell storage capacity;
    a second memory layer having non-volatile memory cells comprising a second bit per cell storage capacity, the second bit per cell storage capacity being greater than the first bit per cell storage capacity; and
    a third memory layer having non-volatile memory cells comprising a third bit per cell storage capacity, the third bit per cell storage capacity being greater than the second bit per cell storage capacity;
and
a controller in communication with the interface and the plurality of memory layers, the controller configured to direct data received from the host to one or more of the plurality of layers, and to transfer data between the plurality of memory layers.

2. The memory system of claim 1, wherein the first memory layer and the second memory layer are disposed on a first die and the third memory layer is disposed on a second die.

3. The memory system of claim 1, wherein the plurality of memory layers are disposed on a same die.

4. The memory system of claim 1, wherein each of the plurality of memory layers is disposed on respective separate die.

5. The memory system of claim 1, wherein the first memory layer comprises single level cell (SLC) memory cells having a one bit per cell capacity.

6. The memory system of claim 5, wherein the controller is further configured to direct data received at the interface from the host to the first memory layer when the data received comprises random logical block addresses, and is configured to direct the data received at the interface from the host to the second memory layer when the data received comprises sequential logical block addresses.

7. The memory system of claim 5, wherein the controller is further configured to:
reclaim blocks of memory cells via a block reclaim process within the first memory layer when a number of free blocks in the first memory layer is below a minimum threshold.

8. The memory system of claim 7, wherein the controller is further configured to:
when the percentage of valid data in the first memory layer exceeds the first valid data threshold and when the number of free blocks of memory cells is below the minimum threshold, transfer valid data from a selected block in the first memory layer to the second memory layer.

9. The memory system of claim 8, wherein the selected block comprises a least recently programmed block of valid data.

10. The memory system of claim 8, wherein the selected block comprises a previously programmed block in the first memory layer having valid data of an oldest average age.

11. The memory system of claim 7, wherein to execute the block reclaim process in the first memory layer, the controller is configured to select a block in the first memory layer having a least amount of valid data, copy valid data from the selected block to a relocation block in the first memory layer and return the selected block to a free block pool in the first memory layer.

12. The memory system of claim 11, wherein the controller is configured to copy valid data to the relocation block sequentially from the selected block regardless of a host logical block address associated with the valid data in the selected block.

13. A mass storage memory system, comprising:
an interface adapted to receive data from a host system;
a plurality of memory layers, the plurality of memory layers comprising:
    a first memory layer having non-volatile memory cells comprising a first bit per cell storage capacity;
    a second memory layer having non-volatile memory cells comprising a second bit per cell storage capacity, the second bit per cell storage capacity being greater than the first bit per cell storage capacity; and
    a third memory layer having non-volatile memory cells comprising a third bit per cell storage capacity, the third bit per cell storage capacity being greater than the second bit per cell storage capacity;
and
a controller in communication with the interface and the plurality of memory layers, the controller configured to:
    direct data received at the interface from the host to the first memory layer;
    move data from the first memory layer to the second memory layer when a number of free blocks in the first memory layer is below a first minimum threshold and upon detection of an amount of valid data in the first memory layer exceeding a first valid data threshold; and
    move data from the second memory layer to the third memory layer when a number of free blocks in the second memory layer is below a second minimum threshold and upon detection of an amount of valid data in the second memory layer exceeding a second valid data threshold.

14. The memory system of claim 13, wherein the controller is further configured to:
reclaim blocks of memory cells in a first block reclaim process within the first memory layer when the number of free blocks in the first memory layer reaches the first minimum threshold;
reclaim blocks of memory cells in a second block reclaim process within the second memory layer when the number of free blocks in the second memory layer reaches the second minimum threshold; and
reclaim blocks of memory cells in a third block reclaim process within the third memory layer when a number of free blocks in the third memory layer reaches a third minimum threshold.

15. A method of managing data comprising:
in a memory system having an interface for receiving data from a host, a plurality of memory layers, and a controller in communication with the interface and the plurality of memory layers, the controller:
directing data received at the interface to a first memory layer of the plurality of layers, the first memory layer having non-volatile memory cells comprising a first bit per cell storage capacity;
moving data from the first memory layer to a second memory layer when a first criteria is met, the second memory layer having non-volatile memory cells comprising a second bit per cell storage capacity, the second bit per cell storage capacity being greater than the first bit per cell storage capacity; and
moving data from the second memory layer to a third memory layer when a second criteria is met, the third memory layer having non-volatile memory cells comprising a third bit per cell storage capacity, the third bit per cell storage capacity being greater than the second bit per cell storage capacity.

16. The method of claim 15, wherein directing data received at the interface to the first memory layer comprises only directing data associated with non-sequential host logical block addresses to the first memory layer, and wherein the method further comprises directing data received at the interface and associated with sequential host logical block addresses to the second memory layer.

17. The method of claim 15, wherein moving data from the first memory layer to the second memory layer when the first criteria is met comprises moving valid data from a least recently programmed block in the first memory layer.

18. The method of claim 17, wherein moving data from the second memory layer to the third memory layer when the second criteria is met comprises moving valid data from a least recently programmed block in the second memory layer.

19. The method of claim 15, wherein moving data from the first memory layer to the second memory layer when the first criteria is met comprises moving valid data from a previously programmed block in the first memory layer having valid data of an oldest average age.

20. The method of claim 19, wherein moving data from the second memory layer to the third memory layer when the second criteria is met comprises moving valid data from a previously programmed block in the first memory layer having valid data of an oldest average age.

21. The method of claim 15, wherein the first criteria comprises the first memory layer having less than a first minimum threshold of free blocks and at least a first threshold amount of valid data and the second criteria comprises the second memory layer having less than a second minimum threshold of free blocks and at least a second threshold amount of valid data, and the method further comprises:
reclaiming at least one block of memory cells in the first memory layer when the number of free blocks in the first memory layer is below a first minimum threshold and the first memory layer has less than the first threshold amount of data; and
reclaiming at least one block of memory cells in the second memory layer when the number of free blocks in the second memory layer is below a second minimum threshold and the second memory layer has less than the second threshold amount of data.

22. The method of claim 21 wherein:
reclaiming at least one block of memory cells in the first memory layer comprises selecting a block in the first memory layer having a least amount of valid data, copying valid data from the selected block to a relocation block in the first memory layer and returning the selected block to a free block pool in the first memory layer; and
reclaiming at least one block of memory cells in the second memory layer comprises selecting a block in the second memory layer having a least amount of valid data, copying valid data from the selected block to a relocation block in the second memory layer and returning the selected block to a free block pool in the second memory layer.

23. The method of claim 22, wherein for each respective memory layer the controller is configured to copy valid data to the relocation block in the respective memory layer sequentially from the selected block regardless of a host logical block address associated with the valid data in the selected block.

24. A method of managing data comprising:
in a memory system having an interface for receiving data from a host, a plurality of memory layers, and a controller in communication with the interface and the plurality of memory layers, the controller:
directing data received at the interface to a first memory layer of the plurality of layers, the first memory layer having non-volatile memory cells comprising a first bit per cell storage capacity;
moving less recently updated data from the first memory layer to a second memory layer, the second memory layer having non-volatile memory cells comprising a second bit per cell storage capacity, the second bit per cell storage capacity being greater than the first bit per cell storage capacity; and
moving least recently updated data from the second memory layer to a third memory layer, the third memory layer having non-volatile memory cells comprising a third bit per cell storage capacity, the third bit per cell storage capacity being greater than the second bit per cell storage capacity.

* * * * *